United States Patent [19]

Harrington et al.

[11] Patent Number: 4,532,000
[45] Date of Patent: Jul. 30, 1985

[54] FABRICATION OF SINGLE CRYSTAL FIBERS FROM CONGRUENTLY MELTING POLYCRYSTALLINE FIBERS

[75] Inventors: James A. Harrington, West Lake Village; Antonio C. Pastor, Santa Monica; Arlie G. Standlee, Thousand Oaks; Roger R. Turk, Woodland Hills, all of Calif.

[73] Assignee: Hughes Aircraft Company, El Segundo, Calif.

[21] Appl. No.: 536,596

[22] Filed: Sep. 28, 1983

[51] Int. Cl.$^3$ ................................................ C30B 1/08
[52] U.S. Cl. ........................... 156/620; 156/DIG. 70; 156/DIG. 73; 156/DIG. 105
[58] Field of Search ................. 156/603, 617 R, 620, 156/DIG. 70, DIG. 73, DIG. 78, DIG. 80, DIG. 105; 75/65 ZM

[56] References Cited

U.S. PATENT DOCUMENTS

| | | | |
|---|---|---|---|
| 1,648,690 | 11/1927 | Jacoby | 156/603 |
| 2,855,335 | 10/1958 | Seiler et al. | 156/620 |
| 3,092,462 | 6/1963 | Goorissen | 156/620 |
| 3,234,009 | 2/1966 | Siebertz | 156/620 |
| 3,442,823 | 5/1969 | Müller et al. | 156/620 |
| 3,939,035 | 2/1976 | Keller | 156/603 |
| 3,960,647 | 6/1976 | Faure et al. | 156/603 |
| 4,220,839 | 9/1980 | DeLeon | 219/10.49 R |
| 4,257,841 | 3/1981 | Ross et al. | 156/620 |
| 4,258,009 | 3/1981 | DeLeon et al. | 422/250 |
| 4,410,392 | 10/1983 | Winter | 156/603 |
| 4,428,646 | 1/1984 | Lighty | 350/96.34 |
| 4,451,116 | 5/1984 | Pinnow et al. | 65/2 |
| 4,458,986 | 7/1984 | Yoto et al. | 350/96.34 |

FOREIGN PATENT DOCUMENTS

1325418  3/1963  France ........................ 156/620

OTHER PUBLICATIONS

Yoshinorimimura et al, Growth of Crystal for Infrared Optical Waveguides, Japenese Journal of Applied Physics, vol. 19, No. 5, May, 1980, pp. L269–L272.
T. J. Bridges et al, Single-Crystal AgBr Infrared Optical Fibers, Optical Society of America, Mar. 1980/vol. 5, No. 3, pp. 85–86.
H. E. LaBelle, Jr., EFG, The Invention and Application to Sapphire Growth, Journal of Crystal Growth, 50 (1980) pp. 8–17.
P. Antonov et al, Physical Problems in Crystal Growth by the Stepnov Method, Journal of Crystal Growth, 50 (1980) pp. 3–7.

*Primary Examiner*—David L. Lacey
*Attorney, Agent, or Firm*—A. W. Karambelas

[57] ABSTRACT

This invention provides a method for conversion of congruently melting polycrystalline fibers to single crystal fibers. The method is particularly useful for production of fibers ranging from about 30 μm to about 1,000 μm in diameter, which are capable of infrared (IR) transmission and of functioning in nonlinear optical applications. The polycrystalline fiber is converted to a single crystal fiber by creating a melt zone near one end of said polycrystalline fiber and then causing said melt zone to travel a length of said polycrystalline fiber at least once, so that the fiber continuously melts and recrystallizes into a single crystal along the length so that such length becomes one continuous crystal.

In another embodiment of the invention, the method described above is utilized to improve the surface characteristics of a single crystal.

In yet another embodiment of the invention, the method disclosed above is utilized to produce a fiber comprised of a polycrystalline core surrounded by a single crystal sleeve or large grained crystal sleeve which evidences single crystal behavior. This method is particularly useful for production of fibers ranging from about 30 μm to 1,000 μm in diameter, which are capable of infrared (IR) transmission. If the sleeve is a sufficiently large proportion of the fiber produced, this method is particularly useful for production of fibers which may be capable of functioning in nonlinear optical applications.

12 Claims, 2 Drawing Figures

FABRICATION OF SINGLE CRYSTAL FIBERS FROM CONGRUENTLY MELTING POLYCRYSTALLINE FIBERS

The Government of the United States of America has rights in this invention pursuant to Contract No. N00014-79-C-0691 awarded by the Department of the Navy.

BACKGROUND OF THE INVENTION

1. Field of the Invention

This invention relates to a method of producing single crystal fibers for use as infrared (IR) transmissive waveguides and in various nonlinear optical interactions. The single crystal fiber is produced from congruently melting polycrystalline fiber feedstock via a continuous process. Variations within the process permit production of a fiber with a polycrystalline core surrounded by a large grained or single crystal sleeve, as well as surface improvement of an already existing single crystal fiber.

2. Description of the Prior Art

Single crystal fiber growth has been obtained using a number of different methods. The earliest and most basic is the Stepanov method, a derivative of the Czochralski method of bulk single crystal growth, in which the feedstock is melted in an inert crucible and held at melting point while a crystal is pulled from the free surface of the melt. The shape of the crystal is influenced by a crucible orifice, functioning as a shaper, with dimensions approximating those of the crystal. There are numerous variations within this method, including the La Belle, Bridges, and Mimura techniques for shaped crystal growth which utilize a shaper, the surface of which physically contacts the melt in a manner which shapes the crystal through surface tension of the liquid. The Stepanov techniques are described by Antonov, P. I. et al., "Physical Problems in Crystal Growth by the Stepanov Method", Journal of Crystal Growth, 50, 3–7 (1980) and La Belle, H. E. Jr. et al., "EFG, The Invention and the Application to Sapphire Growth", Journal of Crystal Growth, 50, 8–17 (1980). The length of the fiber obtained using the Stepanov method is determined by the diameter of the fiber and the volume of melt in the crucible.

Methods have also been developed for continuous growth of single crystal fibers. One method of continuous growth of single crystal fibers is described by Y. Mimura et al in "Growth of Fiber Crystals for Infrared Optical Waveguides", Japanese Journal of Applied Physics, 19, L269–L272 (1980). This method uses a polycrystalline feed rod which is melted in a crucible and flows through a heated capillary to a heated shaper via gravity. Upon exiting the shaper in a downward direction, the melt is frozen into a single crystal fiber which is transported between rollers to a collection area. The capillary and shaper are used to confine and shape the melt into the resultant fiber.

Another method of growing single crystal fibers from a melt is described by T. J. Bridges et al. in "Single-Crystal AgBr Infrared Optical Fibers", Optics Letters 5, 85–86 (1979). This method differs from that of Y. Mimura et al. in that the feed to the capillary and shaper is controlled using nitrogen gas pressure on the melt crucible, the fiber is pulled upward from the melt, and the total amount of feedstock is that contained in the melt crucible, initially, before nitrogen gas pressure is applied.

A method for continuous growth of polycrystalline fibers has also been developed. Polycrystalline fibers for use in infrared radiation transmission have been continuously extruded using elevated temperatures and high pressures. This process is described in a patent application of D. A. Pinnow et al., Ser. No. 230,923 filed on Feb. 2, 1981, now U.S. Pat. No. 4,451,116 and assigned to the assignees of the present application. Application Ser. No. 230,923 is a continuation of application Ser. No. 037,581, filed May 9, 1979, which was a continuation of the parent application, Ser. No. 800,149, filed May 24, 1977, now abandoned.

Single crystal silicon rods for use in the semiconductor industry are also grown by a continuous process. Typically, a polycrystalline feed rod is melted and recrystallized to convert it from polycrystalline form to a single crystal. However, the diameter of such feed rods ranges from about one centimeter to ten centimeters, and thus a special seeding technique is required to insure single crystal growth. In addition, in order to obtain cylindrical crystals, the feed rod or at least the seed crystal is rotated, and the melt is achieved using an induction heater which generates an electromagnetic field which assists in shaping during the recrystallization process. This continuous process is known as the "float" zone method because the melt is not confined by a capillary or shaping tube. It is important to emphasize that the linear growth rate of these single crystal semiconductor rods decreases as the diameter of the rods increases. The length of melt zone necessary to achieve complete melting of the cross-section of the rods described above results in some flow of the melt, such that a mechanical equilibrium exists. Since the resultant equilibrium is mechanical, a steady state condition does not exist, and the crystal diameter varies periodically as is manifested by ripples on the surface of the rod, such ripples having an amplitude exceeding the typical diameter of a fiber. Recent patents which provide a good description of the float zone method are U.S. Pat. Nos. 4,258,009, 4,257,841, and 4,220,839.

The prior art, as typified in the Stepanov method, has demonstrated that single crystal fibers for use in infrared (IR) transmission and nonlinear electro-optical devices can be drawn from the free surface of a melt contained in a crucible or confined by a shaper. However, such fibers frequently exhibit undesirable surface characteristics in the form of faceting or presence of contaminants. The faceting is due to both thermal gradients unavoidable in the growth process, and strain which is induced when shapers or capillary tubes are used to control the dimensions of the fiber as it is drawn; the contaminants often arise from contact with the crucible or shaper. The surface characteristics described above result in loss of IR transmission due to scattering and absorption.

The prior art has also demonstrated that polycrystalline fibers for use in IR transmission can be fabricated using pressure driven extrusion techniques. However, such polycrystalline fibers cannot be used in nonlinear optical devices which require the lattice structure of a single crystal. In addition, residual strains in the fibers induced during the extrusion process are believed to contribute significantly to transmission losses.

It is therefore desirable to provide a method which will permit conversion of IR transmitting polycrystalline fibers to single crystal fibers which are optically isotropic in the case of transmitting materials or optically anisotropic in the case of nonlinear materials, and free from surface defects and residual strain.

SUMMARY OF THE INVENTION

Accordingly, it is the primary aim of this invention to provide a method of producing a single crystal fiber capable of transmitting infrared radiation or of functioning in nonlinear optical applications, by using a polycrystalline congruently melting fiber as the starting material and converting the polycrystalline fiber to a single crystal. In order to facilitate such conversion, a melt zone is created near one end of the fiber and caused to traverse a length of the fiber at least once, so that the fiber continuously melts and recrystallizes into a single crystal until the length becomes one continuous single crystal.

In another embodiment of the above described invention, the surface characteristics of a single crystal fiber can be improved by substituting such single crystal fiber in place of the polycrystalline fiber. In this embodiment, the energy input into the melt zone is reduced in order to control the depth of melt penetration along the radius of the fiber.

In yet another embodiment of the invention, the method is used to produce a fiber comprised of a polycrystalline core surrounded by a single crystal sleeve or large grained crystal sleeve which evidences a single crystal behavior. In such embodiment, the energy input into the melt zone is controlled, so that the depth of melt does not pass all the way through the polycrystalline feed fiber. The depth of melt penetration into the fiber radius determines the relative proportions of polycrystalline core and large grained or single crystal sleeve.

The present invention offers simplicity in process requirements as compared with prior art methods for production of single crystal materials since seeding techniques, rotation of the fiber, and use of induction heating to provide electromagnetic forces to shape the fiber are not required. The simplicity of this method is evidenced in that one begins with a fiber in order to make a fiber. At the same time, the fibers produced using the method of the invention may exhibit improved properties over single crystal fibers produced using prior art methods.

DETAILED DESCRIPTION OF THE INVENTION

The present invention provides a method for conversion of polycrystalline, congruently melting, infrared transmitting fibers to a single crystal form.

Figure 1:
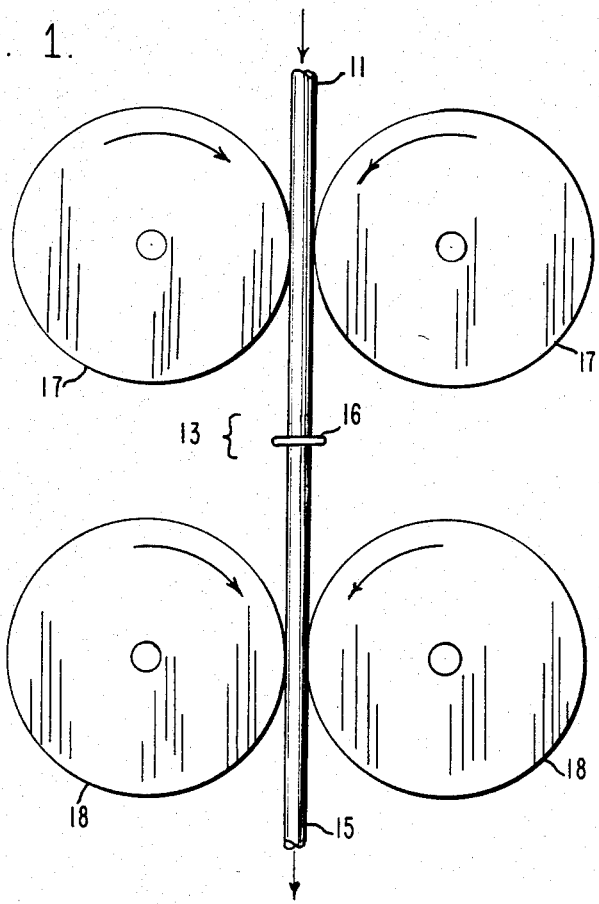
FIG. 1 depicts a schematic of a typical apparatus used to facilitate the method of the invention.

In a typical practice of the invention, as shown in FIG. 1, the extruded polycrystalline fiber 11 is exposed to an energy source 16 of adequate power for a time sufficient to cause such fiber to melt, forming a melt zone 13 at the point of energy input. The length of the melt zone 13, which is typically at least about 0.5 times the fiber diameter, is initiated near one end of the fiber and caused to move along the length of the fiber so that a continuous single crystal is formed. Based on economic considerations, it is preferred that the length of the melt zone be less than about 4 times the fiber diameter. As shown in the FIG. 1 schematic of a typical apparatus used to facilitate the method of the invention, a polycrystalline feed fiber 11 is conveyed to the point of energy input 16, via a set of drive wheels 17. The energy necessary to create the melt zone 13 is supplied by a resistance ring heater in this example; the ring heater is connected to a power source which is not shown. After exiting the melt zone area 13, the melt recrystallizes to a single crystal continuously, producing a single crystal fiber 15. A second set of drive wheels 18 is used to control the rate of fiber exit from the melt zone. By varying the relative speeds of the feed drive wheels 17 and the fiber exit wheels 18, the relative diameters of the polycrystalline and single crystal fibers can be controlled. The single crystal fiber produced may be larger or smaller in diameter than the feed polycrystalline fiber.

It is apparent to one skilled in the art that the method of the invention is not dependent on the typical apparatus described above, but that there are many possible techniques which can be used to cause the energy source which creates the melt zone to traverse the length of the fiber. In addition, the source of energy used to produce the melt may be any form of radiant energy.

Figure 2:
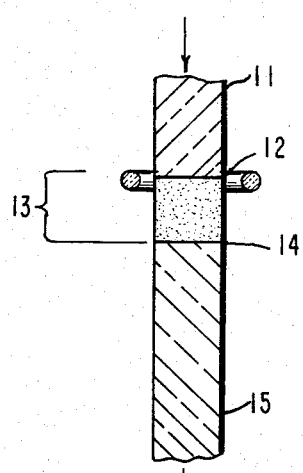
FIG. 2 depicts the steady state conditions existing in the area of the melt zone during the process of conversion of the fiber from polycrystalline to single crystal form.

FIG. 2 depicts the steady state conditions existing in the area of the melt zone during the process of conversion from polycrystalline to single crystal fiber. Interface 12 between the polycrystalline fiber 11 and the melt zone 13 and interface 14 between the melt zone 13 and the single crystal fiber 15 are stationary relative to the energy input source in spite of the movement of the fiber. If the rate of movement of the energy source along the length of the fiber is too slow, the molten segment may become too long and the surface tension of the melt may be insufficient to prevent molten material from spilling out, causing a discontinuity in the recrystallized fiber. If the rate of movement of the energy source along the fiber becomes too rapid, interface 14 will overtake interface 12 and conversion of the polycrystalline fiber to single crystal fiber will not occur. These considerations are met by providing for a rate of movement of the energy source along the fiber length such that a melt zone is created which is at least about 0.1 times the fiber diameter, and typically at least about 0.5 times the fiber diameter.

The polycrystalline congruently melting fiber used as the starting material is a member of the group consisting of a Group 1a metal halide, a Group 1b metal halide, a Group 2a metal fluoride, and a Group 2b metal fluoride. Preferably, the starting material is a member of the group consisting of a monovalent metal halide or an alkaline-earth metal fluoride. Most preferably the starting material is a member of the group consisting of AgCl, AgBr, TlBrI, TlBrCl, TlBr, TlCl, KBr, KCl, CuCl, CsCuCl$_3$, BaF$_2$, CaF$_2$, and SrF$_2$. Such fiber may be produced by any feasible method, but the fibers used in development of the method of this invention have been produced using pressure driven extrusion techniques. Said techniques are described in U.S patent application Ser. No. 230,923, wherein an infrared transmitting material is placed in the barrel of an extruder, heated to a temperature slightly below its melting point, and forced under pressure down the barrel and through an extrusion die which is approximately the diameter of the fiber to be produced. Such fibers range from about 30 μm to about 1000 μm in diameter.

The diameter of the fiber is important because the method of the present invention uses the surface tension of the melt to control the dimensions of the melt until it is recrystallized. In contrast, the prior art, such as the float zone method, utilizes a rotational motion, in which the entire configuration shown in FIG. 2 is rotated, combined with electromagnetic forces generated by the RF induction heating coil to control the dimensions of the melt. Bulk crystals from about 10,000 μm to about 100,000 μm in diameter are grown using the float zone technique; however, such bulk crystals have a very irregular surface with a high degree of defects, because the surface tension effects utilized by this invention are inadequate to constrain the melt when such large diameter crystals are grown.

The melt zone along the fiber can be created either by utilizing a stationary energy source and moving the fiber past the energy source or by holding the fiber stationary and moving the energy source along the length of the fiber. The orientation of the fiber relative to ground level is unimportant; the method of the present invention has been practiced using a vertical fiber orientation as shown in FIG. 1 and a horizontal fiber orientation, not shown. Surface tension appears to be adequate, within the method of this invention, to prevent melt zone dislocation at either of the above orientations, and therefore at any intermediary orientation. The length of the energy input zone and the time that a point along the length of the fiber is within that zone must be carefully controlled as previously mentioned. A typical time period that a point along the length of the fiber is within the melt zone ranges from about 0.01 to about 25 seconds, depending on the fiber diameter. The energy input rate and length of the energy input zone as well as possible throughput rates for the fiber depend on the material composition and the diameter of the fiber.

The growth conditions for a single crystal fiber having a uniform cross section and a length that is several orders of magnitude greater than its cross section can be analyzed under steady state conditions. During steady state crystal growth from the melt zone, if one assumes that the interface 14 between the melt zone 13 and the single crystal fiber 15 acts as an isothermal heat source at the temperature of crystallization, then it is possible to calculate a crystal growth rate. The single crystal growth progresses only if the latent heat of crystallization is channeled away from the melt side of the growth interface at a rate matching the growth rate of the crystal. If one also assumes that heat is withdrawn from the interface exclusively through longitudinal thermal conduction, the crystal growth rate can be calculated as follows:

$$R = (kM/pH_c)dT/dz$$

where R is the linear (axial or longitudinal) growth rate, k is the axial thermal conductivity of the material being crystallized, M is the molecular weight of such material, p is the density of such material near its melting point, $H_c$ is the molar latent heat of crystallization of such material and dT/dz is the axial temperature gradient in the crystal near the growth interface. Once the growth rate of the crystal is estimated, given the diameter of the fiber, heat transfer calculations can be made which indicate energy input and density requirements, as well as preferred throughput rates for such fiber. Such heat transfer calculations are well known to those skilled in the art.

The single crystal fiber produced is typically the same diameter as the polycrystalline precursor fiber, but it may be a larger or smaller diameter. A smaller diameter fiber is produced by placing tension on the fiber as it passes through the melt zone, so that a drawing effect is achieved. Such drawn fibers may range in diameter from slightly smaller to about 0.30 times the diameter of the initial polycrystalline fiber.

In another embodiment of the invention, the method described above is utilized to improve the surface characteristics of a single crystal fiber. In such case, the single crystal fiber is substituted in place of the polycrystalline fiber. The amount of energy input to a given fiber is reduced from that required to completely melt the single crystal fiber to that required to melt such fiber the desired depth along its radius from the outside surface inward. The depth of melt penetration along the fiber radius will depend on the depth of defects, e.g. faceting, sought to be corrected, and may be up to about 0.9 times the fiber radius.

In yet another embodiment of the invention, the method disclosed above is utilized to produce a fiber comprised of a polycrystalline core surrounded by a large grained or single crystal sleeve. A single crystal is, of course, the limit of large grained crystal growth. In such case, the amount of energy input to a given polycrystalline fiber is reduced from that required to completely melt such fiber to that required to create a melt at the desired depth along the radius of the fiber from the outside surface inward.

EXAMPLES

Example I

A specific example of the first embodiment described above is the conversion of silver bromide polycrystalline congruently melting fiber to single crystal fiber. The polycrystalline feed fiber was placed in an apparatus similar to that shown in FIG. 1. The fiber was moved past the resistance ring heater 16 using the drive wheels 17 and 18. The power input to the ring heater was 0.87 watts. The fiber diameter was 620 μm; the length of the melt zone created was 620 μm; and the fiber was moved through the melt zone at a rate of 0.5 meter/hour. The diameter of the single crystal fiber produced was about 620 μm. A length of fiber 80 centimeters was converted from polycrystalline to single crystal form.

Visual inspection under a microscope indicated that conversion from polycrystalline to single crystal form had occurred. On application of tension to the fiber, (110) slip bands appeared, indicating growth on the (100) axis. The polycrystalline feed fiber exhibited a transmission loss of 2.55 dB/meter, and the single crystal fiber exhibited a transmission loss of 6.6 dB/meter. Theoretically the single crystal fiber should exhibit a transmission loss lower than that of the polycrystalline fiber. However, at the time of the experiment described in this example, the mechanism utilized to provide movement of the fiber past the ring heater still required optimization in order to provide smooth motion, and the temperature control in the melt zone area was not adequate. As a result, the surface of the single crystal fiber still exhibited minor imperfections which resulted in scattering of the transmitted light. It should be noted, however, that the transmission loss of 6.6 dB/meter is an improvement over that obtained for single crystal fibers of this material formed using prior art procedures.

Example II

In a second example of the primary invention, the polycrystalline congruently melting fiber was silver chloride. The fiber diameter of the polycrystalline feed fiber and the process conditions utilized were the same as those given above for silver bromide. Again, visual inspection under a microscope indicated conversion from polycrystalline to single crystal form and tension evaluations indicated growth on the (100) axis.

Example III

A specific example of the second embodiment of the invention is the surface improvement of a silver bromide single crystal fiber. The fiber was placed in the apparatus previously described and processed using the technique previously described. The diameter of such single crystal fiber was 620 $\mu$m initially, and the fiber was moved through the melt zone at a rate of 0.5 meter/hour. In order to prevent a complete melt of the fiber as it passed through the melt zone, the power to the resistance heater was reduced to 0.77 watts. The diameter of the fiber after processing remained at 620 $\mu$m, and examination of the fiber under a microscope indicated that the melt progressed about 20% of the distance inward along the radius from the outside surface of the fiber. It is apparent that reduction of the power input to the resistance heater permitted control of the depth of melt from the surface of the fiber. Depth of melt could also have been controlled by variation of the rate at which the fiber passed through the power input area.

Example IV

A specific example of the third embodiment of the invention is the production of a fiber comprised of a polycrystalline core surrounded by large grained or single crystal sleeve, wherein the fiber composition was polycrystalline silver bromide and the fiber diameter as well as the process conditions were the same as those described in Example III. Again, the fiber diameter after processing remained at 620 $\mu$m, and examination of the fiber under a microscope indicated that the melt progressed about 20% of the distance inward along the radius from the outside surface. The sleeve was determined to be essentially single crystal using a preferential etching technique. The etchant used was $Na_2S_2O_3$ which preferentially etches the (110) planes.

What is claimed is:

1. A method of producing a single crystal fiber capable of transmitting infrared radiation comprising:
   (a) providing a polycrystalline congruently melting fiber; and
   (b) converting said polycrystalline fiber to said single crystal fiber by creating a melt zone near one end of said polycrystalline fiber and then causing said melt zone to travel a length of said polycrystalline fiber at least once, so that said fiber continuously melts and recrystallizes into a single crystal along said length such that said length becomes one continuous crystal.

2. The method of claim 1 wherein said polycrystalline starting fiber is a congruently melting material consisting essentially of a material selected from the group consisting of Group 1a and 1b metal halides and Group 2a and 2b metal fluorides.

3. The method of claim 1 wherein the diameter of said single crystal fiber produced is about the same as that of said polycrystalline fiber.

4. The method of claim 1 wherein the diameter of the resultant single crystal fiber ranges between the initial diameter of said polycrystalline fiber and about 0.30 times such initial diameter.

5. A method of producing a single crystal fiber of between about 30 $\mu$m and about 1,000 $\mu$m in diameter capable of transmitting infrared radiation or of functioning in nonlinear optical applications comprising:
   (a) proving a polycrystalline congruently melting fiber having a diameter of about between 30 $\mu$m and 1,000 $\mu$m and
   (b) converting said polycrystalline fiber to polycrystalline said single crystal fiber by creating a melt zone penetrating said polycrystalline fiber and near one end of said polycrystalline fiber and then causing said melt zone to travel the length of said polycrystalline fiber at least once so that said fiber continuously melts and recrystallizes into a single crystal along said length such that said length becomes one continuous crystal.

6. The method of claim 5 wherein said polycrystalline congruently melting fiber consists essentially of a material selected from the group consisting of Group 1a and Group 1b metal halides and Group 2a and Group 2b metal fluorides.

7. The method of claim 6 wherein said polycrystalline congruently melting fiber consists essentially of a monovalent metal halide or an alkaline-earth metal fluoride.

8. The method of claim 7 wherein said polycrystalline congruently melting fiber consists essentially of a material selected from the group consisting of AgCl, AgBr, TlBrI, TlBrCl, TlBr, TlCl, KBr, KCl, CuCl, $CsCuCl_3$, $BaF_2$, $CaF_2$, and $SrF_2$.

9. The method of claim 5 wherein the length of said melt zone is at least 0.1 times the diameter of said polycrystalline congruently melting fiber.

10. The method of claim 5 wherein the time duration during which a point along the fiber's length is within the melt zone ranges from about 0.01 seconds to about 25 seconds.

11. The method of claim 5 wherein the diameter of the single crystal fiber produced is about the same as that of said polycrystalline fiber.

12. The method of claim 5 wherein the fiber is drawn while within the melt zone so that the resultant single crystal fiber diameter ranges between the initial diameter of said polycrystalline fiber and about 0.30 times such initial diameter.

* * * * *

UNITED STATES PATENT AND TRADEMARK OFFICE
CERTIFICATE OF CORRECTION

PATENT NO. : 4,532,000

DATED : July 30, 1985

INVENTOR(S) : James A. Harrington et al.

It is certified that error appears in the above-identified patent and that said Letters Patent is hereby corrected as shown below:

On the title page inventors should read:

--(75) Inventors: Antonio C. Pastor, Santa Monica;
James A. Harrington, West Lake Village;
Roger R. Turk, Woodland Hills;
Arlie G. Standlee, Thousand Oaks,
all of California. --

Signed and Sealed this

Tenth Day of December 1985

[SEAL]

Attest:

DONALD J. QUIGG

Attesting Officer

Commissioner of Patents and Trademarks